United States Patent [19]
Ho et al.

[11] Patent Number: 5,528,082
[45] Date of Patent: Jun. 18, 1996

[54] THIN-FILM STRUCTURE WITH TAPERED FEATURE

[75] Inventors: Jackson H. Ho, Palo Alto; Robert R. Allen, deceased, late of San Francisco, by Jason Huynh, executor; Tzu-Chin Chuang, Saratoga, all of Calif.

[73] Assignee: Xerox Corporation, Stamford, Conn.

[21] Appl. No.: 235,010

[22] Filed: Apr. 28, 1994

[51] Int. Cl.$^6$ ............... H01L 23/48; H01L 23/52; H01L 29/76; H01L 27/01

[52] U.S. Cl. ............ 257/775; 257/412; 257/350; 257/766; 257/773; 257/920

[58] Field of Search ............... 257/59, 72, 350, 257/412, 763–766, 773, 775, 927, 920; 437/192, 245

[56] References Cited

U.S. PATENT DOCUMENTS

| | | | |
|---|---|---|---|
| 4,782,380 | 11/1988 | Shankar et al. | 257/764 |
| 5,132,745 | 7/1992 | Kwasnick | 257/412 |
| 5,162,933 | 11/1992 | Kakuda et al. | 257/59 |
| 5,324,674 | 6/1994 | Possin et al. | 437/41 |
| 5,436,201 | 7/1995 | Chi et al. | 437/203 |

FOREIGN PATENT DOCUMENTS 1-209764  8/1989  Japan ................ 257/412

OTHER PUBLICATIONS

Ichikawa, K., Suzuki, S., Matino, H., Aoki, T., Higuchi, T., Oana, Y., "14.3–in.–Diagonal 16–Color TFT–LCD Panel Using a Si:H TFTs," *SIDS 93 Digest*, 1989, pp. 226–229.

Kobayashi, K., Hayama, M., Nakagawa, N., Ishibashi, T., Maejima, T., Yamazaki, T., "Fabrication of 10–in.–diagonal 16–gray–level TFT–LCDs by novel processing technologies", *Journal of the SID*, Vol. 1, No 1, 1993, pp. 67–73.

*Primary Examiner*—Mahshid Saadat

[57] ABSTRACT

A feature in a thin-film structure such as an AMLCD array has an edge with a tapered sidewall profile, reducing step coverage problems. The feature can be produced by producing a layer in which local etch rates vary in the thickness direction of the layer. The layer can then be etched to produce the feature with the tapered sidewall profile. The layer can be produced by physical vapor deposition. The layer can, for example, includes sublayers with different etch rates, either due to different atomic proportions of constituents or due to different etchants. Or local etch rates can vary continuously as a result of changing deposition conditions. Differences in etch rates or differences in etchant mixtures can be used to obtain a desired angle of elevation.

15 Claims, 14 Drawing Sheets

THIN-FILM STRUCTURE WITH TAPERED FEATURE

BACKGROUND OF THE INVENTION

The present invention relates to thin-film structures.

It is known to produce a thin-film structure with a feature that is tapered. Tapering may be useful to reduce problems with step coverage. Reverse tapering may be useful in performing liftoff techniques. Resist erosion by plasma etching has been used to produce tapering.

SUMMARY OF THE INVENTION

The invention provides a thin-film structure at a surface of a substrate, and the thin-film structure includes a tapered feature such as a tapered line or a tapered lead. Tapering is achieved by differentially etching a layer within which local etch rate varies.

Tapering can solve problems that arise in producing thin-film structures. For example, an array of light control units for a flat panel display, such as an active matrix liquid crystal display (AMLCD), typically includes two sets of orthogonal metal lines separated by dielectric layers at crossovers. For low line resistivity, a metal thickness approaching or exceeding that of the dielectric layers between the lines may be necessary. Wet etching is a reliable process for producing the bottom metal lines, but conventional wet etch techniques would produce a step-shaped sidewall profile at each edge of each bottom metal line, a profile which may approach vertical with overetch.

The dielectric layers and the top metal lines that cross the bottom metal lines must therefore cover a large number of steps in an array of usual size, which may result in defects. For example, a layer of silicon oxide or nitride crossing over a step-shaped AMLCD scan line is likely to crack if the scan line is thicker than about 1500 angstroms. This maximum thickness constraint produces an undesirably high resistivity for many metals used in scan lines, a problem which becomes more severe as the panels become larger. With lines over 25 cm long, for example, RC delay and line voltage drop from one end of a line to the other can compromise a display's performance.

If scan lines are appropriately tapered, however, the layer of silicon oxide or nitride is unlikely to crack even at significantly larger thicknesses. Therefore, tapered lines can be made sufficient thick to bring resistivity down to satisfy a display's performance requirements. But despite these advantages, tapering is difficult to achieve. Processes such as resist lifting, resist erosion such as with plasma etching, and spacer formation could be used to produce tapering but are difficult to control and therefore do not produce tapered features robustly and reliably.

The invention provides a number of techniques that can produce tapered features robustly and reliably by differentially etching a layer within which local etch rate varies. The techniques vary local etch rates by varying deposition conditions, by varying materials, or by a combination of varying materials and deposition conditions. Depending on the complexity of the materials used, the techniques may require appropriate mixtures of chemical etchants to obtain a desired taper. In general, the techniques can be used to obtain a sidewall profile with any desired angle of taper.

The invention has been implemented to produce a 5000 angstrom thick MoCr scan line with a taper angle of 60 degrees, over which a nitride layer did not crack. The tapered MoCr scan line had a measured resistance of approximately 0.6 ohms/sq, comparable to a step-shaped 1000 angstrom layer of pure aluminum, while a step-shaped 1000 angstrom thick MoCr scan line would have a measured resistance of 3.0 ohms/sq. Several other taper angles have been demonstrated, including 30 degrees and 6 degrees.

The invention can be implemented by producing a layer within which local etch rate varies with position in the z-direction, the direction perpendicular to the substrate's surface. Then, a pattern of mask material can be formed using lithographic techniques, and an etching operation can remove areas not covered by the pattern. The etching operation also produces taper at the boundary between an area covered by the pattern and an adjacent area that is not covered, producing a tapered feature. Then, the pattern of mask material can be removed.

One of the techniques provides a thick sublayer with a slower local etch rate, capped by a thin sublayer with a faster local etch rate. Each sublayer could be an alloy, with all the alloys including the same materials, but in different proportions or deposited under different conditions to obtain different local etch rates with the same etchant. After etching, the thick sublayer has a tapered sidewall profile while the thin sublayer's profile is not significantly tapered. The local etch rates of the sublayers can be adjusted to obtain different angles of taper. If necessary, the thin capping sublayer could be removed after etching to obtain a more evenly tapered profile.

Another technique provides alternating sublayers of two materials that etch at different rates with different etchants that can be mixed. Each layer of the slower etching material delays the start of etching of layers below it. As a result, the layers of faster etching material etch for different periods of time, producing a tapered sidewall profile. The layers of slower etching material can be thin enough to be fully etched away once the faster etching material has been etched. Alternatively, remaining parts of the layers of slower etching material can be removed by a subsequent etching operation. The proportions of etchants in the mixed etchant can be adjusted to obtain a desired angle of taper.

The invention is advantageous compared to other techniques that could be used to produce tapered features. In comparison with photoresist lifting, the invention is more robust because photoresist lifting relies on a failure mechanism of resist adhesion, a failure mechanism that is hard to control and that can produce poorly defined boundaries. In comparison with plasma etching to produce resist erosion, the invention is more reliable because it is easier to control and much more uniform over large areas. In comparison with spacer formation, the invention is simpler and more reliable.

The following description, the drawings, and the claims further set forth these and other aspects, objects, features, and advantages of the invention.

DETAILED DESCRIPTION

A. Conceptual Framework

Figure 1:
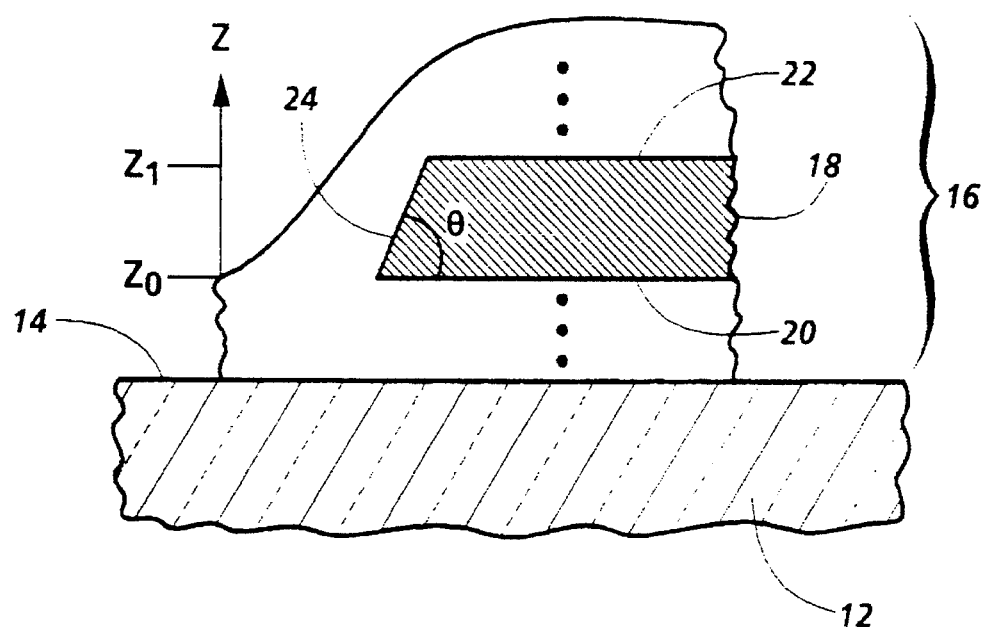
FIG. 1 is a schematic cross-section of a thin-film structure that includes a tapered feature within which local etch rate varies in the thickness direction.

The following conceptual framework is helpful in understanding the broad scope of the invention, and the terms defined below have the indicated meanings throughout this application, including the claims. "Circuitry" or a "circuit" is any physical arrangement of matter that can respond to a first signal at one location or time by providing a second signal at another location or time, where the second signal includes information from the first signal. Circuitry "stores" a first signal when it receives the first signal at one time and, in response, provides the second signal at another time. Circuitry "transfers" a first signal when it receives the first signal at a first location and, in response, provides the second signal at a second location.

A signal "indicates" or "selects" one of a set of alternatives if the signal causes the indicated one of the set of alternatives to occur.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." The "direction of thickness" or "thickness direction" of a layer or part of a layer formed over a surface is a direction extending from the side toward the surface to the side away from the surface. The "lateral direction" of a layer or part of a layer formed over a surface is a direction extending generally parallel to the surface.

To "etch" is to remove parts of one or more layers of material. To "wet etch" is to etch using liquid chemical reactions. To "dry etch" is to use gas-phase reactants, inert or active ionic species, or a mixture of these to etch by chemical processes, physical processes, or a mixture of these, respectively.

An "etchant" is a fluid used to etch. An etchant may include two or more fluids, referred to herein as "sub-etchants," that could also be used separately as etchants.

To perform "physical vapor deposition" is to cause a material to be deposited on a physical structure without a chemical reaction. Examples include sputtering, vacuum evaporation, and e-beam deposition.

To "sputter from" a solid material is to bombard the solid material with energetic ions so that atoms from the solid material are dislodged by direct momentum transfer, making it possible to deposit the dislodged atoms elsewhere. The solid material may be referred to as a "target."

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

A "thin-film structure") is a physical structure that is formed from layers of material at a surface of a substrate. A thin-film structure could be formed, for example, by deposition and patterned etching of layers on the substrate's surface.

During production of a thin-film structure at a surface, a part of a first layer "covers" a part of a second layer if the part of the second layer is between the part of the first layer and the surface.

A "feature" in a thin-film structure formed at a surface of a substrate is a part of the structure that is formed from a layer and is bounded by at least one edge that extends between a first side toward the surface and a second side away from the surface.

An "etch rate" is a rate at which an etching operation removes material. A "local etch rate" is an etch rate in a region of a layer or part of a layer in which etch rates vary. An etch rate "for an etchant" is an etch rate for an etching operation that uses the etchant.

A feature has a local etch rate for an etchant that "varies with position in the thickness direction" in a feature if the local etch rate for the etchant within the feature is a function of position in the thickness direction.

The "sidewall profile" of an edge of a feature is the profile that extends between the feature's first side and the feature's second side at the edge, and can be viewed by taking a section of the edge.

The sidewall profile of an edge of a feature in a thin-film structure formed at a surface of a substrate is "tapered" if the projection of the line at which the sidewall profile meets the feature's second side is not the same as the line at which the sidewall profile meets the feature's first side.

The "angle of elevation" of a sidewall profile is the angle formed at the line at which the sidewall profile meets the feature's first side between the surface of the substrate extending under the feature and the surface of the sidewall extending to the line at which the sidewall profile meets the feature's second side. If the sidewall is not planar, the "angle of elevation" may be an approximation obtained locally by treating the sidewall's surface as the plane that includes the local line segments at which the sidewall profile meets the feature's first and second sides.

An "alloy" is a material that is a macroscopically homogeneous mixture of two or more metals. In an alloy or other mixture of two or more elements, the relationship between the quantities of atoms of the elements can be expressed as an "atomic percent," an "atomic proportion," or an "atomic ratio."

An "integrated circuit" is a circuit formed at a substrate's suffice by batch processes such as deposition, lithography, etching, oxidation, diffusion, implantation, annealing, and so forth.

A "lead" is a part of a component at which the component is electrically connected to other components. A "conductive line" or "line" is a simple conductive component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

A "channel" is a part of a component through which electric current can flow. A channel is "conductive" when the channel is in a state in which current can flow through it.

A "channel lead" is a lead that connects to a channel. A channel may, for example, extend between two channel leads.

A "transistor" is a component that has a channel that extends between two channel leads, and that also has a third lead—referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

A "thin-film transistor" or "TFT" is a transistor that is part of a thin-film structure. The term "thin-film transistor" includes transistors with multiple gates.

An "image" is a pattern of physical light.

When an image is a pattern of physical light in the visible portion of the electromagnetic spectrum, the image can produce human perceptions. The term "graphical feature", or "feature", refers to any human perception produced by, or that could be produced by, an image.

An image may be divided into "segments," each of which is itself an image.

A segment of an image may be of any size up to and including the whole image.

"Image output circuitry" is circuitry for providing data defining images as output.

An "image output device" is a device that can provide output defining an image.

"Display circuitry" is circuitry that can receive data defining a sequence of images and present versions of the images in sequence so that a viewer can perceive the versions of the images in sequence. A "display" is an image output device that includes display circuitry. Display circuitry or a display may, for example, include a cathode ray tube; an array of light emitting, reflecting, or absorbing elements; a structure that presents sequences of images on a screen, paper, or another medium; or any other structure capable of presenting sequences of images in response to data that define them. To "present an image" on display circuitry or a display is to operate the display circuitry or display so that a viewer can perceive the image.

A "segment of images" presented by a display is at the same relative position within all the images.

Circuitry or a circuit "causes presentation of a segment" or "presents a segment" of images if the segment is presented in response to the circuitry or circuit.

A "light control unit" is a part of display circuitry that is structured to receive a signal and to respond to its signal by causing presentation of an image segment with one of a set of colors.

An "array of light control units" is an arrangement of light control units that can cause presentation of segments that together form an image. An array of light control units can, for example, extend in first and second directions that are perpendicular, forming rows and columns.

B. General Features

Figure 2:
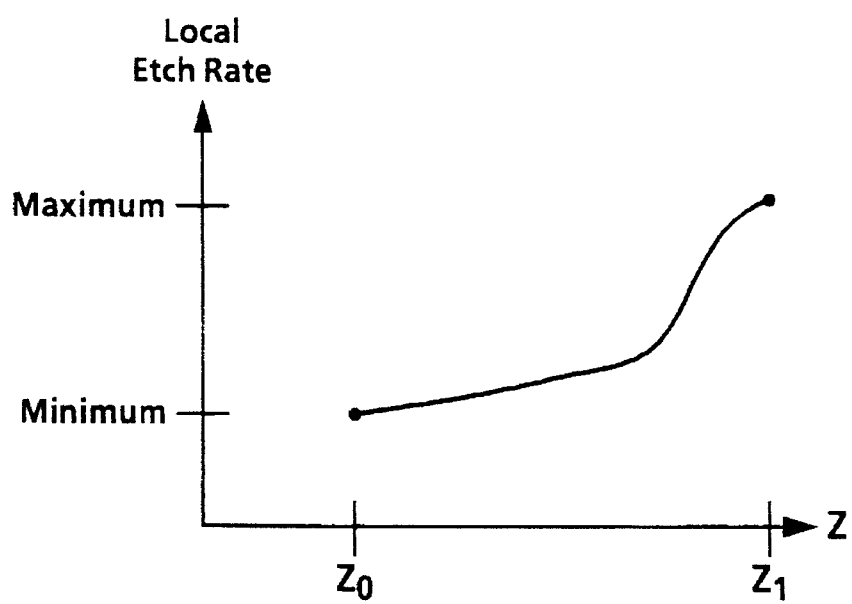
FIG. 2 is a graph showing local etch rate as a function of position in the thickness direction in a layer in which local etch rate varies continuously.
Figure 3:
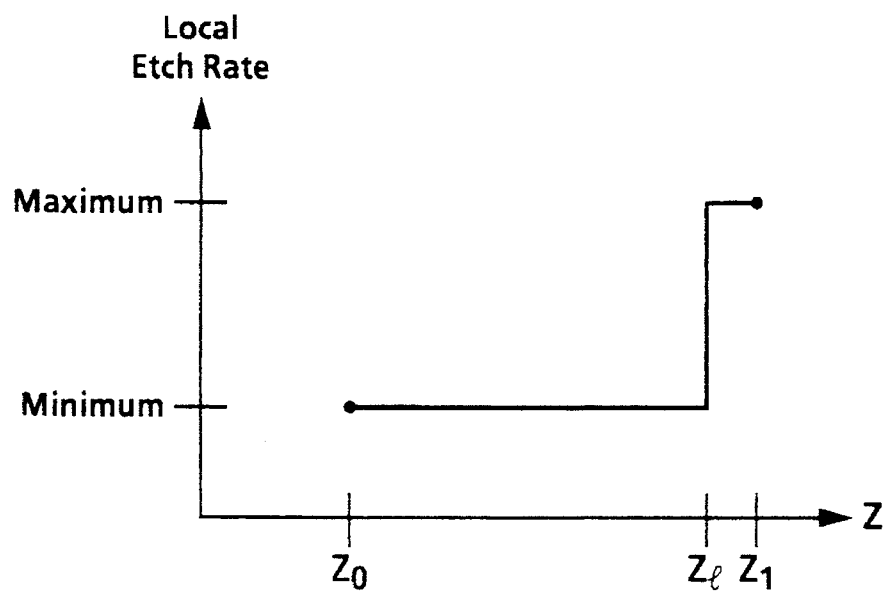
FIG. 3 is another graph showing local etch rate as a function of position in the thickness direction in a layer that includes two sublayers with different local etch rates.
Figure 4:
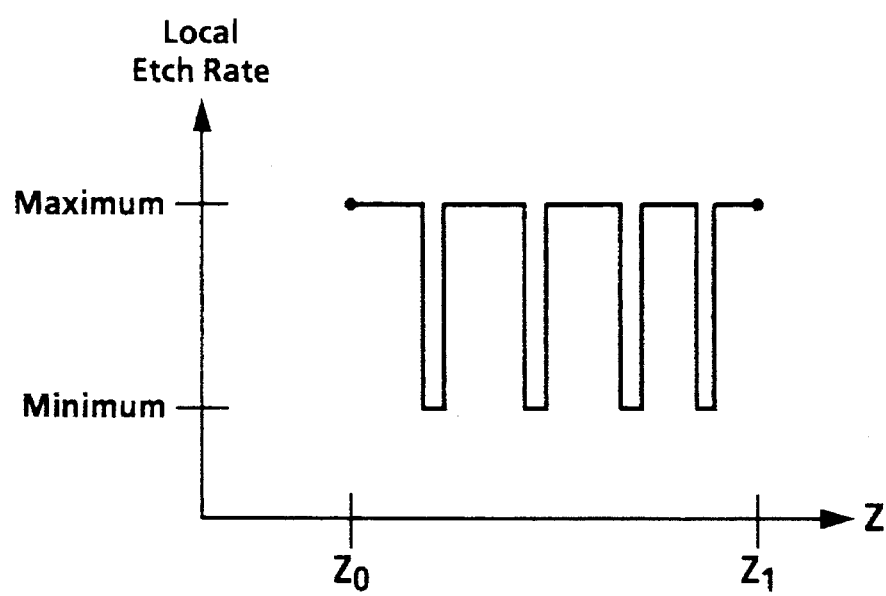
FIG. 4 is another graph showing local etch rate as a function of position in the thickness direction in a layer that includes alternate sublayers with different local etch rates.
Figure 5:
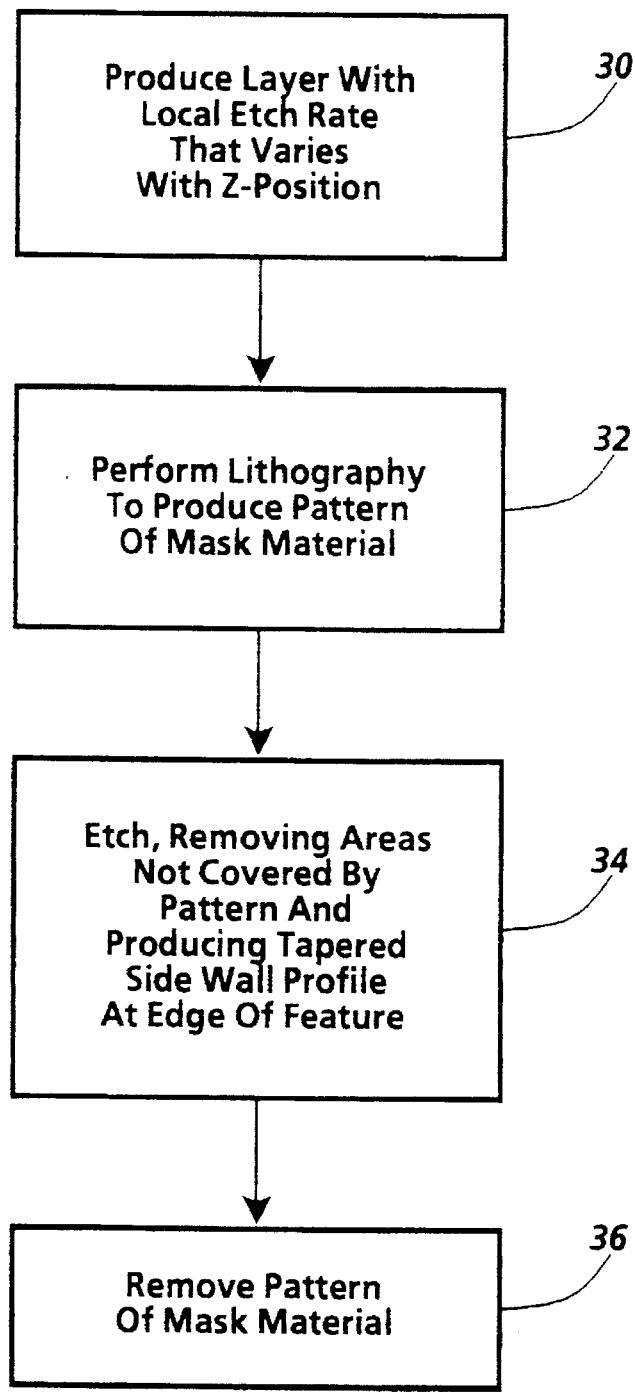
FIG. 5 is a flow chart showing general acts in producing a thin-film structure with a tapered feature within which local etch rate varies.

FIGS. 1 shows a thin-film structure that includes a feature with a tapered sidewall profile at an edge. FIG. 2 shows how local etch rate can vary continuously in the thickness direction of a layer. FIG. 3 shows how local etch rate can differ in two sublayers of a layer. FIG. 4 shows how local etch rate can differ in alternate sublayers of a layer. FIG. 5 shows general acts in producing a feature with a tapered sidewall profile at an edge.

Product 10, shown in cross-section in FIG. 1, includes substrate 12 with surface 14 at which thin-film structure 16 is formed. Thin-film structure 16 includes feature 18 with first side 20 toward surface 14, second side 22 away from surface 14, and edge 24 extending between first side 20 and second side 22. Feature 18 could be on surface 14 but, as suggested by the ellipses in FIG. 1, thin-film structure 16 can also include one or more layers between feature 18 and surface 14. Thin-film structure 16 can also include one or more layers above feature 18.

Feature 18 can be etched by an etchant, and the local etch rate for the etchant varies in the thickness or z-direction from first side 20 at $z_o$ to second side 22 at $z_1$. As a result of the varying local etch rate, the sidewall profile of edge 24 has been tapered by an etching operation using the etchant, and has an angle of elevation θ that is not equal to 90°.

The curve in FIG. 2 shows one way in which local etch rate could vary as a function of z between $z_0$ and $z_1$. The local etch rate curve in FIG. 2 begins at a minimum at $z_0$ and increases monotonically to a maximum at $z_1$. Although it may be possible to obtain a continuously varying local etch rate curve as illustrated in FIG. 2 by varying conditions of deposition or by continuously changing proportions of materials in a layer, a continuously varying local etch rate curve may be difficult to achieve in practice.

The curve in FIG. 3 shows another way in which local etch rate could vary as a function of z. Rather than increasing monotonically, as in FIG. 2, the etch rate curve in FIG. 3 increases discontinuously at a boundary $z_l$ between layers. As discussed below, the sublayer under $z_l$ is a thick sublayer with a slow etch rate, but the sublayer above is a thin capping sublayer with a fast etch rate.

The curve in FIG. 4 shows another way local etch rate could vary. In this case, the local etch rate curve increases at some boundaries between sublayers and decreases at others, because the layer includes sublayers that alternate between a fast local etch rate and a slow local etch rate. This local etch rate curve produces a tapered sidewall profile because of differences in etch time at different sublayers, as discussed in more detail below. In FIG. 5, the act in box 30 begins by performing deposition to produce a layer with a local etch rate for an etchant, the local etch rate varying in the thickness or z-direction of the layer. The act in box 30 could produce a layer with a local etch rate curve as illustrated in FIGS. 2–4 or with another type of local etch rate curve. The act in box 32 performs lithography to produce a pattern of mask material that covers a part of the layer that has the shape of a feature. The act in box 34 then etches to remove areas not covered by the pattern of mask material from box 32. As a result of the etch in box 34, the covered part of the layer forms a feature with an edge. The act in box 34 also etches the edge with the etchant so that the edge's sidewall profile is tapered. The act in box 36 removes the pattern of mask material.

C. Implementation

The general features described above could be implemented in numerous ways to provide a thin-film structure with a tapered feature on a surface of a substrate. As described below, the general features have been implemented in a number of ways.

C.1. Array

Figure 6:
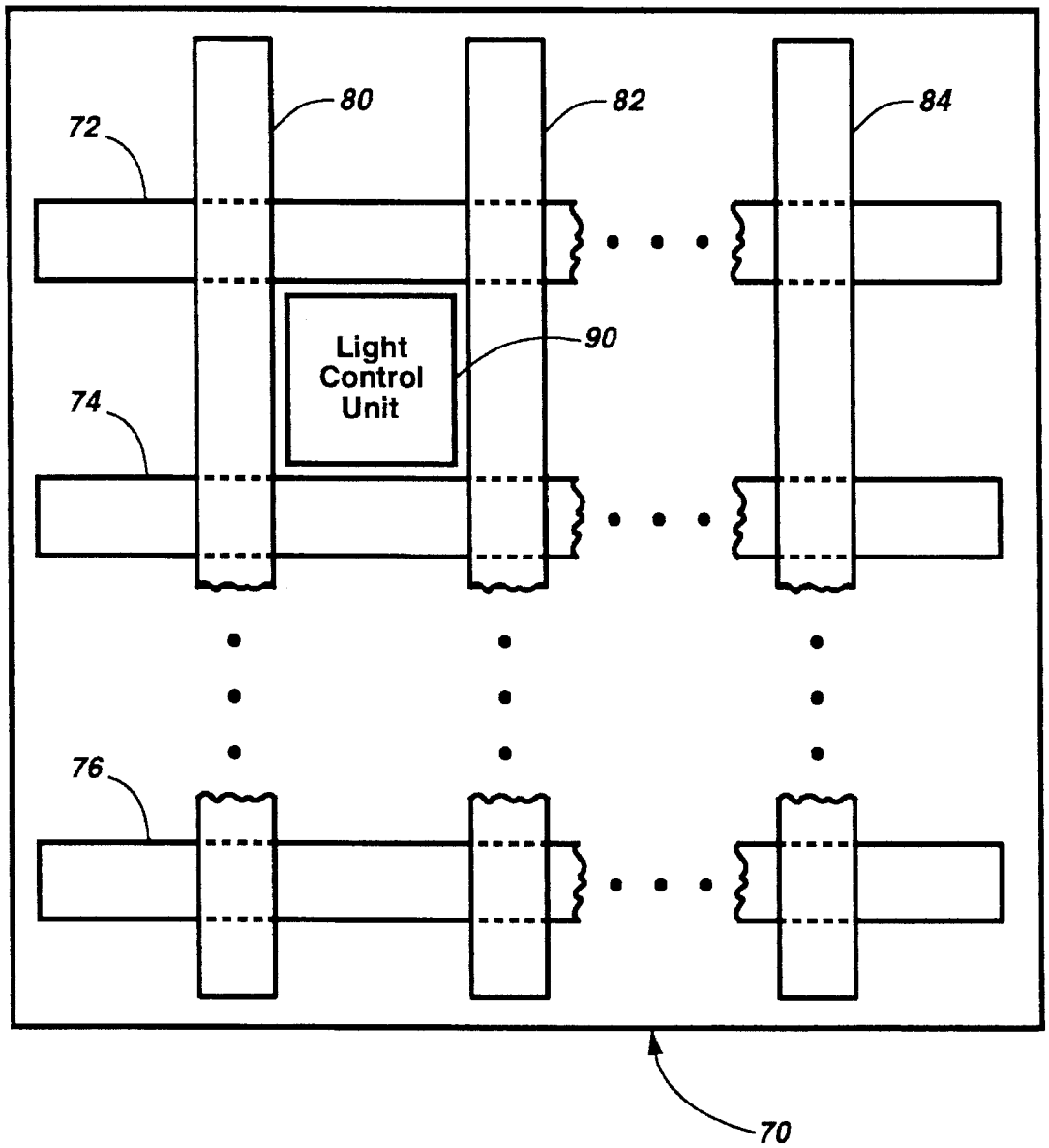
FIG. 6 is a schematic plan view of a layout of an array of light control units with tapered conductive lines.
Figure 7:
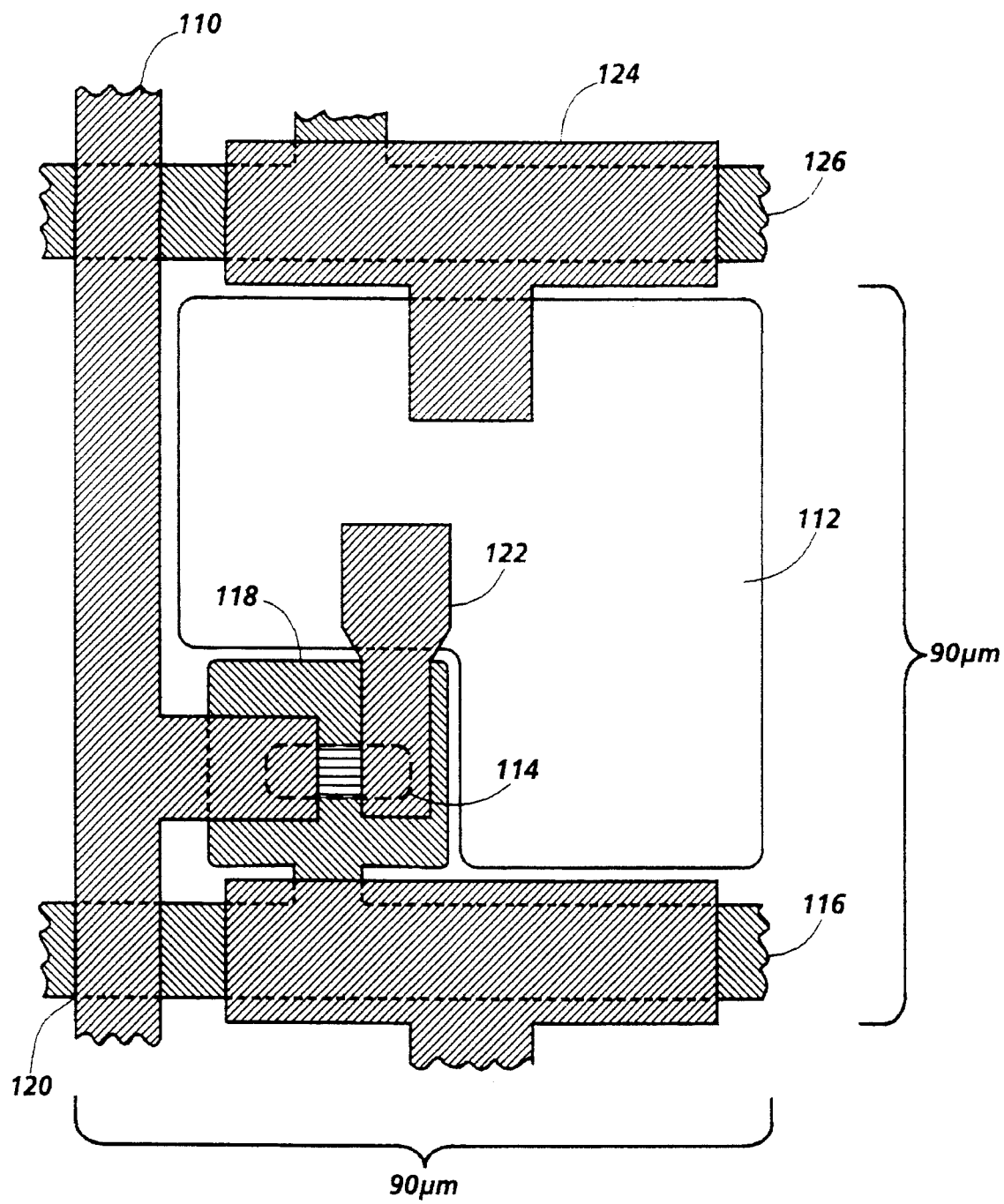
FIG. 7 is a plan view of a layout of a light control unit in an implementation of the array of FIG. 3.

FIG. 6 shows a partial layout of an array with tapered scan lines. FIG. 7 shows a layout of a light control unit in the array of FIG. 6.

Array 70 in FIG. 6 includes scan lines 72, 74, through 76 and data lines 80, 82, through 84. Scan lines 72, 74, through 76 are tapered conductive lines, with scan lines 74 through 76 each connected to a row of light control units to provide a signal selecting the light control units in that row. Illustrative light control unit 90, for example, receives its signal from scan line 74.

In some implementations, each light control unit in array 70 could be receive a binary signal from its scan line, so that the light control unit is driven either in its fully ON saturation state or in its fully OFF saturation state, as described in copending, coassigned U.S. patent application Ser. No. 08/235,011, entitled "Thin-Film Structure With Dense Array of Binary Control Units for Presenting Images" ("the Array Application"), incorporated herein by reference. Alternatively, each light control unit could receive a multi-level signal that can indicate three or more gray levels. In either case, conductivity of scan lines is important—as conductivity declines, the scan signal becomes damped and delayed, causing problems with delay of binary signals or with damping of non-saturation gray levels. Tapered conductive lines can provide sufficient conductivity to alleviate this problem because they can be thicker than conductive lines with edges that have step-shaped sidewall profiles.

FIG. 7 shows a light control unit implemented in accordance with the Array Application. FIG. 7 shows several layers of a thin-film structure, with upper layers that are farthest from the substrate's surface obscuring lower layers.

The uppermost layer shown in FIG. 7 is a top metal layer, which forms data line 110 connected to a channel lead of a transistor in the light control unit; the top metal layer also forms several other features described below. The next layer shown is a layer of indium-tin-oxide (ITO), which forms transparent electrode 112. The next layer is a top nitride layer, which forms island 114, part of the transistor. The lowest layer shown is a bottom metal layer, which forms gate line 116 and, connected to it, gate lead 118, which serves as the gate lead of the transistor.

Data line 110 can be implemented with a resistance of 0.2 ohm/sq. and can be driven at −8 V, 0 V, and +8 V. Data line 110 provides a data signal to a column of binary control units, one of which is shown in FIG. 4. The part of data line 110 that extends over gate lead 118 connects to the source lead of the transistor.

Gate line 116 similarly provides a scan signal to a row of binary control units. Gate line 116 can be implemented with a resistance of 1.4 ohm/Sq and can be driven at +15 V and −15 V.

Data line 110 and gate line 116 are each 10 μm wide. Data line 110 crosses over gate line 116 in crossover region 120. Crossover region 120 can include an insulator formed by the top nitride layer, and other features as necessary to ensure that the two lines conduct signals adequately and that signals in the two lines do not interfere.

Transparent electrode 112 connects to the drain lead of the transistor through drain line 122, formed by the top metal layer. Therefore, when the transistor is conductive due to a scan signal provided to gate lead 118 by gate line 116, transparent electrode 112 receives and stores a drive signal from data line 110 through drain line 122.

Transparent electrode 112 also connects to charging lead 124, which implements one electrode of a storage capacitor and is formed by the top metal layer. Gate line 126, formed by the bottom metal layer, implements the other electrode of the storage capacitor; gate line 126 also provides a scan signal to the preceding binary control unit in the same column.

The Array Application describes in greater detail how array 70 can be implemented.

C.2. Two Sublayers

Figure 8:
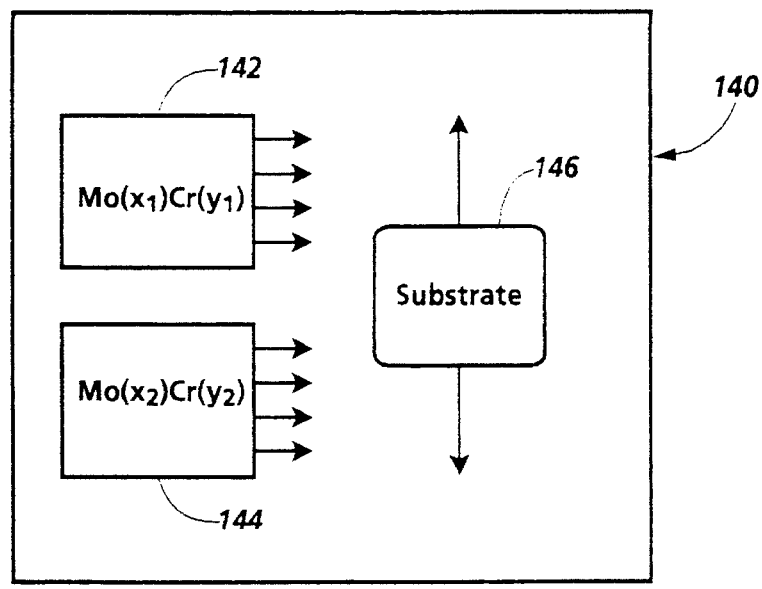
FIG. 8 is a schematic view of a sputtering chamber with two molybdenum-chromium targets.
Figure 9:
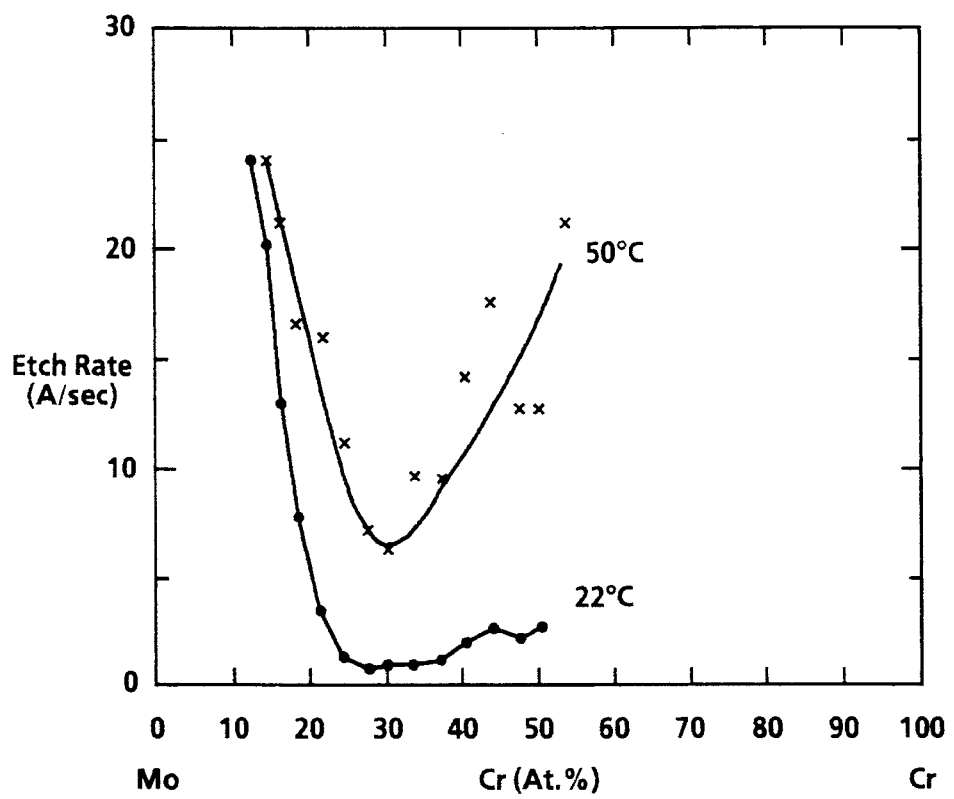
FIG. 9 is a graph showing etch rate as a function of atomic proportions of molybdenum and chromium and of etch temperature.
Figure 10:
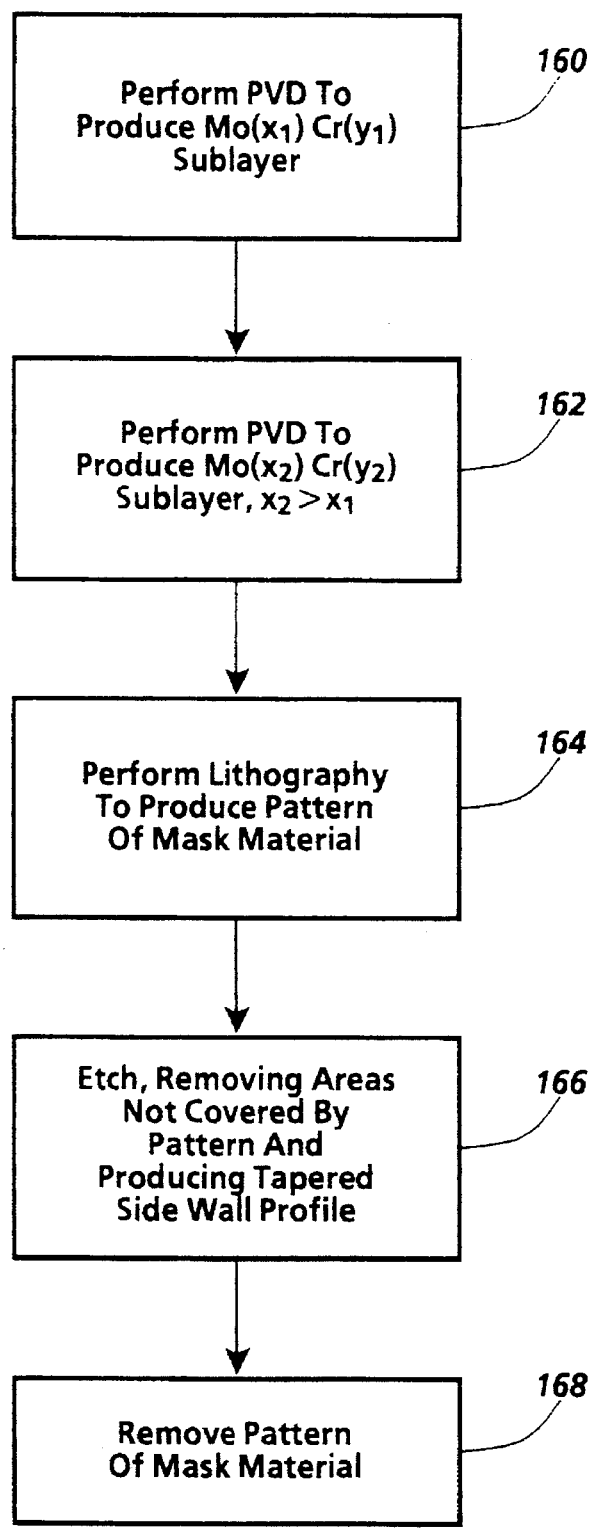
FIG. 10 is a flow chart showing acts in producing a tapered conductive line that includes molybdenum and chromium.
Figure 11:
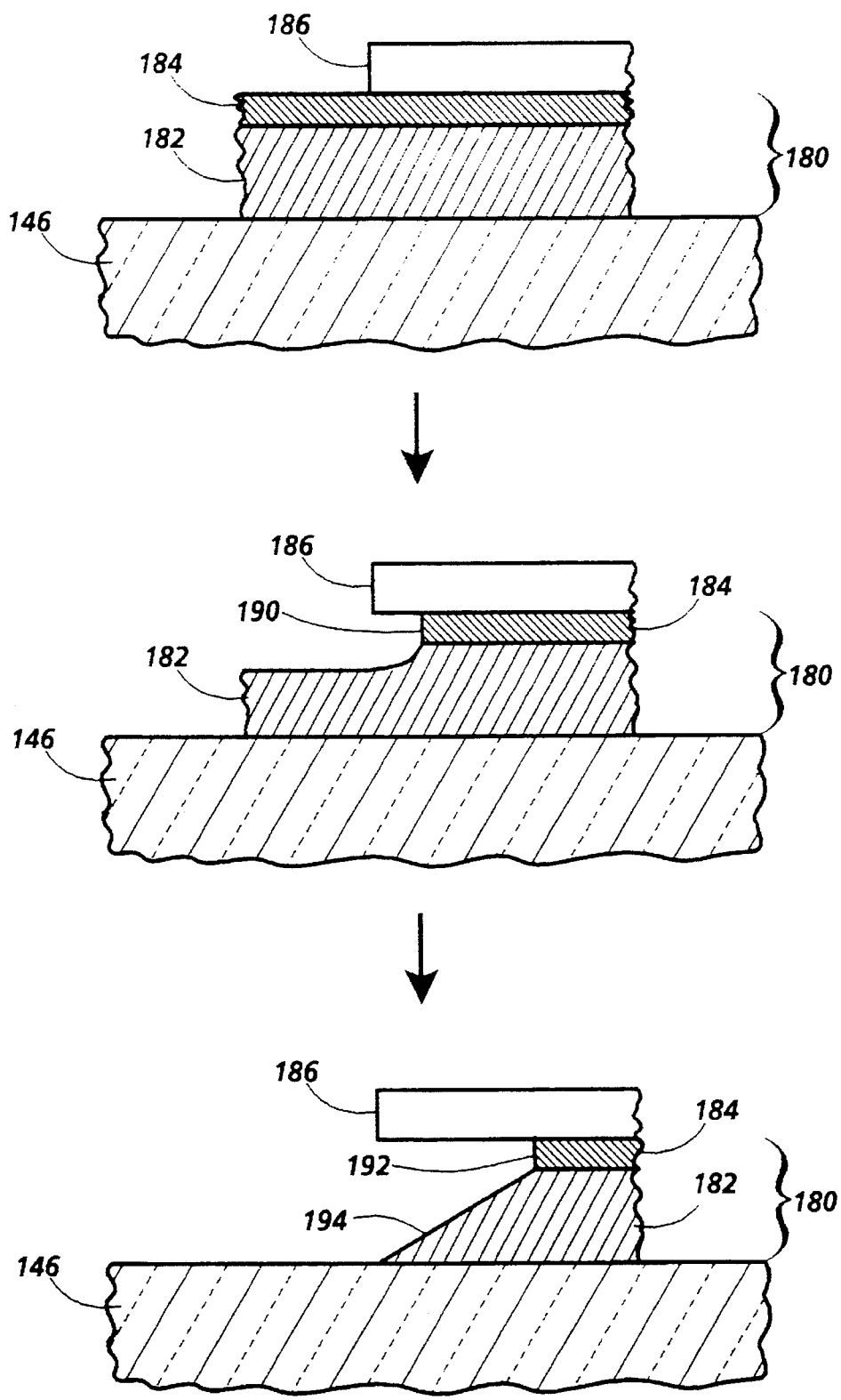
FIG. 11 is a flow diagram showing stages in producing a tapered conductive line as in FIG. 10.

FIG. 8 shows how two sputtering targets can be used to produce a layer with local etch rates as in FIG. 3. FIG. 9 illustrates etch rate as a function of atomic proportions of molybdenum and chromium. FIG. 10 shows acts in producing a layer using two targets as in FIG. 8. FIG. 11 illustrates stages in etching a layer produced as in FIG. 10 FIGS. 12–14 show actual features with tapered sidewall profiles at their edges, produced by acts as in FIG. 10.

Chamber 140 in FIG. 8 can be the vacuum chamber of a conventional magnetron sputtering machine. In chamber 140 are target 142, a first alloy target of $Mo(x_1)Cr(y_1)$, and target 144, a second alloy target of $Mo(x_2)Cr(y_2)$, where $Y_n=(1-x_n)$ and where $(x_n/y_n)$ is the atomic ratio of molybdenum to chromium in a molybdenum-chromium alloy. Substrate 146 is within chamber 140, mounted so that it can be moved back and forth between a first position adjacent target 142 for deposition of the first alloy and a second position adjacent target 144 for deposition of the second alloy. Sputtering can be performed using conventional techniques, as further described in copending, coassigned U.S. patent application entitled "Thin-Film Structure With Conductive Molybdenum-Chromium Line," incorporated herein by reference, FIG. 9 illustrates etch rates, measured in angstroms per second, for different Mo(x)Cr(y) alloys at different etch temperatures, illustrating why two different alloys can be used to produce sublayers with different local etch rates. As shown, at an etch temperature of 50° C., etch rates fall almost linearly from around 15 atomic percent molybdenum to around 30 atomic percent molybdenum, then rise almost linearly. At an etch temperature around room temperature, illustratively 22° C., etch rates fall from around 15 atomic percent molybdenum to around 25 atomic percent molybdenum, then remain almost constant. It is possible to obtain a ratio between etch rates greater than 3:1 between two sublayers with different atomic proportions of molybdenum.

The act in box 160 in FIG. 10 begins by performing physical vapor deposition (PVD) to produce a first sublayer that includes $Mo(x_1)Cr(y_1)$. The act in box 162 then performs physical vapor deposition (PVD) to produce a second sublayer that includes $Mo(x_2)Cr(y_2)$, where $x_1 > x_2$ so that the local etch rate of the second sublayer is significantly faster than the local etch rate of the first. Together the first and second sublayers form a layer that include molybdenum and chromium, with each sublayer including an MoCr alloy, and with a local etch rate that varies with position in the thickness direction. The acts in boxes 160 and 162 can be implemented using the arrangement in FIG. 8, by first positioning substrate 146 for sputtering from target 142 to produce the first sublayer, then moving substrate 146 to position is for sputtering from target 144 to produce the second sublayer.

The act in box 164 performs lithography to produce a pattern of mask material that covers a part of the layer of molybdenum and chromium that has the shape of a feature. The act in box 166 then etches to remove areas not covered by the pattern of mask material from box 164. As a result of the etching operation in box 166, the covered part of the MoCr layer forms a feature that includes molybdenum and chromium. In addition, the act in box 166 etches differentially under the pattern boundary to produce an edge of the feature with a tapered sidewall profile. The act in box 168 then removes the pattern of mask material from the feature.

FIG. 11 shows stages in the act in box 166 in FIG. 10. In the first stage, before etching begins, layer 180 is on substrate 146, with sublayers 182 and 184. Layer 180 can be 5000 angstroms thick, for example, with sublayer 182 being 4600 angstroms thick and 83 atomic percent molybdenum, while sublayer 184 is a thin capping sublayer 400 angstroms thick and 87 atomic percent molybdenum. These atomic proportions result in an etch ratio of approximately 2.5 at room temperature, as can be seen from FIG. 9. Resist 186 covers part of layer 180 with the shape of a feature to be produced.

After etching begins, as shown in the second stage in FIG. 11, sublayer 184 is quickly etched away in areas that are not covered by resist 186, and then begins to etch away under resist 186, as illustrated by intermediate sidewall 190. Because sublayer 184 is etched away, part of sublayer 182 under resist 186 is exposed to the etchant and is etched, but not as deeply as in areas not covered by resist 166 because the etching period is shorter.

Finally, when the etchant has etched through sublayer 182 in areas not covered by resist 186, non-tapered sidewall 192 of sublayer 184 and tapered sidewall 194 of sublayer 182 together form the sidewall profile of the resulting feature, as shown in the third stage in FIG. 11.

After the third stage in FIG. 11, resist 186 can be removed by the act in box 168 in FIG. 10. Sublayer 184 could also be a sacrificial layer that is removed by an appropriate operation to obtain a more uniformly tapered sidewall profile.

Figure 12:
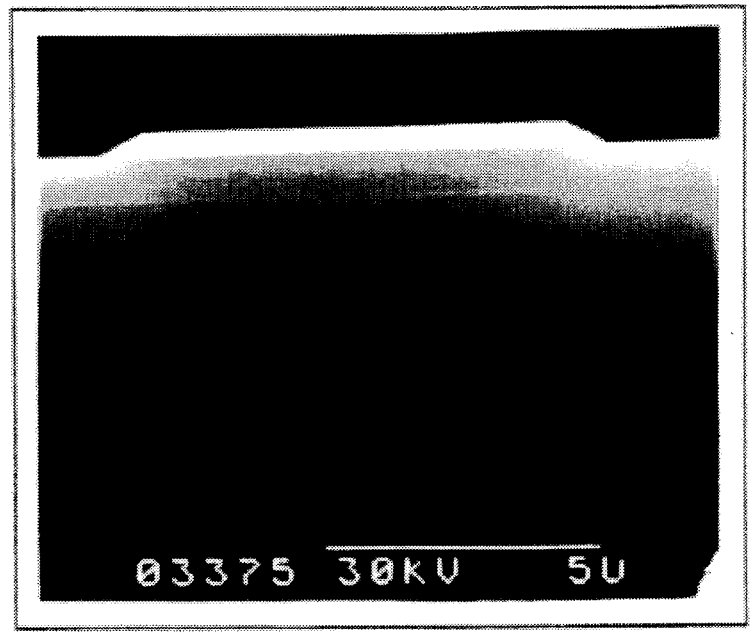
FIG. 12 is a scanning electron microscope view of a cross-section of a tapered line produced as in FIG. 10.

FIG. 12 shows a scanning electron microscope (SEM) image of a cross-section of a conductive line produced by acts as in FIG. 10, with the first sublayer being 4600 angstroms and having 75 atomic percent of molybdenum and with the second sublayer being 400 angstroms and having 60 atomic percent of molybdenum. The line is approximately 15 µm wide and 0.5 µm thick. As shown, the resulting angle of elevation of the sidewall profile at each edge of the conductive line is approximately 30°.

Figure 13:
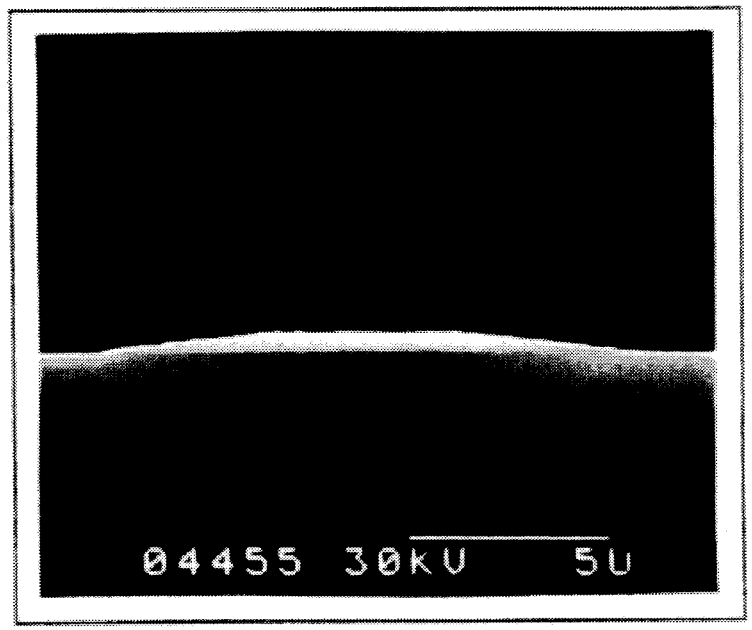
FIG. 13 is a scanning electron microscope view of a cross-section of another tapered line produced as in FIG. 10.

FIG. 13 shows an SEM image of a cross-section of another conductive line produced by acts as in FIG. 10, with the first sublayer being 4600 angstroms and having 85 atomic percent of molybdenum and with the second sublayer being 400 angstroms and having 60 atomic percent of molybdenum. The line is approximately 15 µm wide and 0.5 µm thick. As shown, the resulting angle of elevation of the sidewall profile at each edge of the conductive line is approximately 6°.

Figure 14:
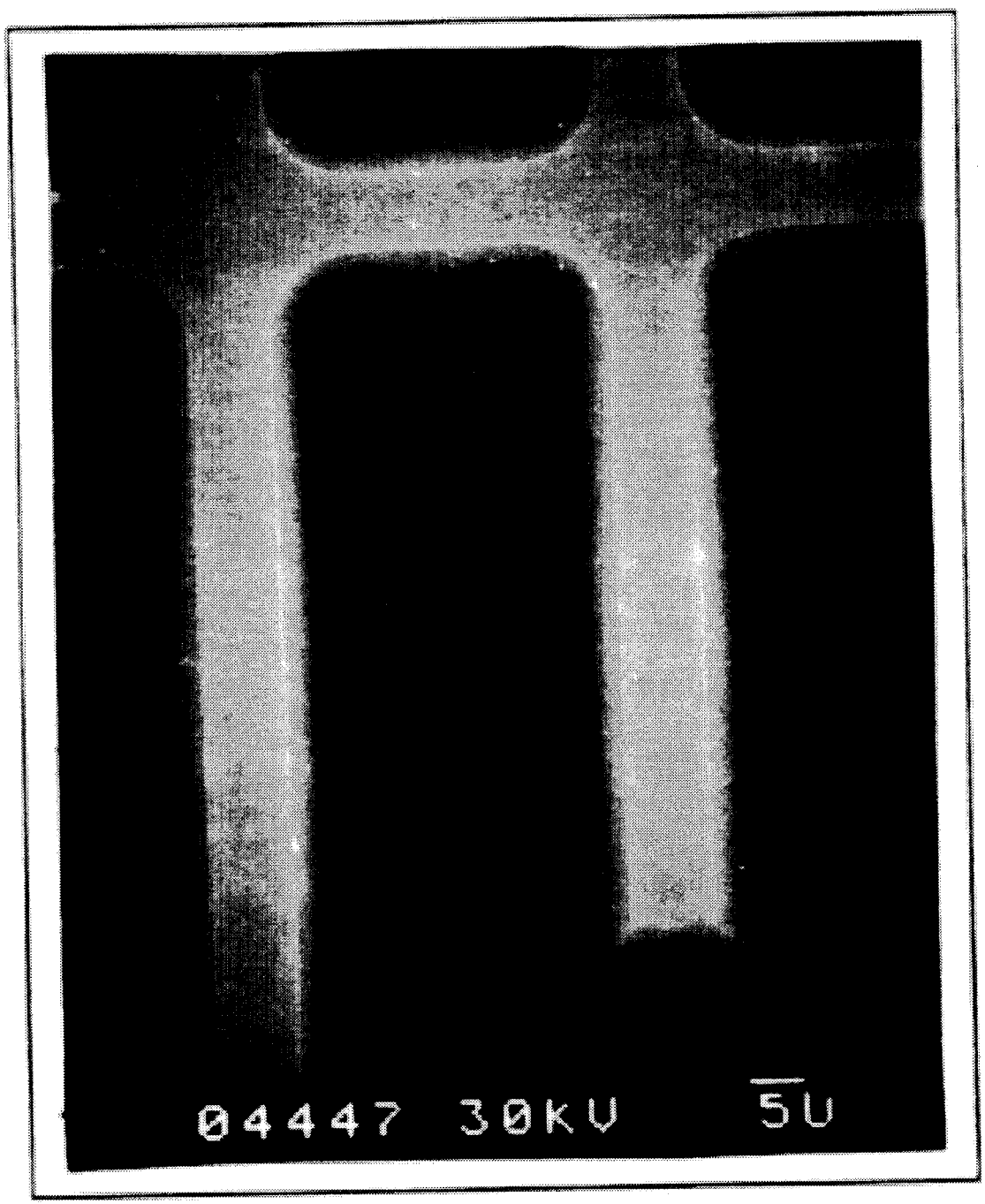
FIG. 14 is a scanning electron microscope top view of a tapered line produced as in FIG. 10.

FIG. 14 shows an SEM image of an arrangement of conductive lines produced by acts as in FIG. 10, with the same angle of elevation as in FIG. 13. Tapering can be seen at the periphery of each line.

FIGS. 12–14 show that edges with tapered sidewall profiles have been successfully produced using the two sublayer technique described above. In addition, chemical vapor deposition of a dielectric layer of silicon nitride over conductive lines as illustrated in FIGS. 12–14 and also with angles of elevation of 60° have shown conformal coverage with no problem at the edge of a conductive line.

C.3. Multiple Sublayers

Figure 15:
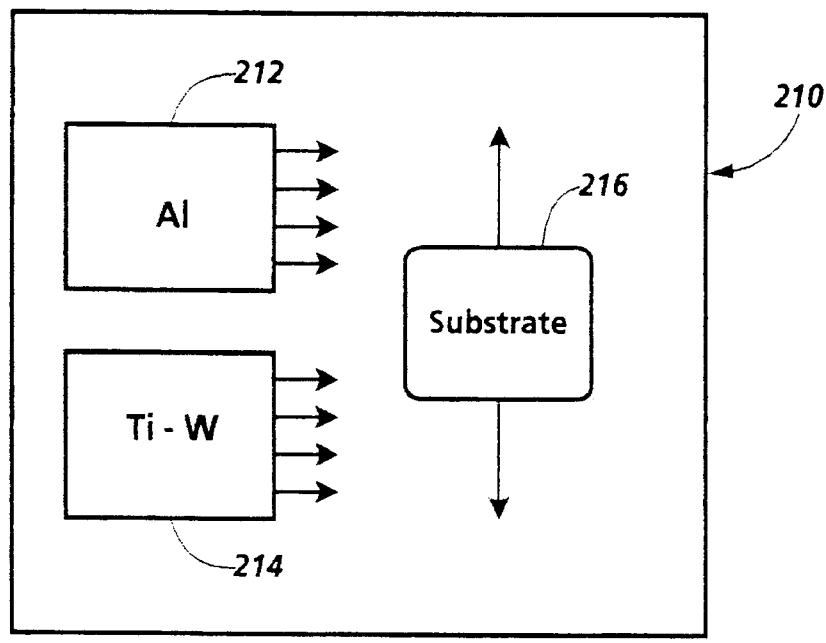
FIG. 15 is a schematic view of a sputtering chamber with an aluminum target and a titanium-tungsten target.
Figure 16:
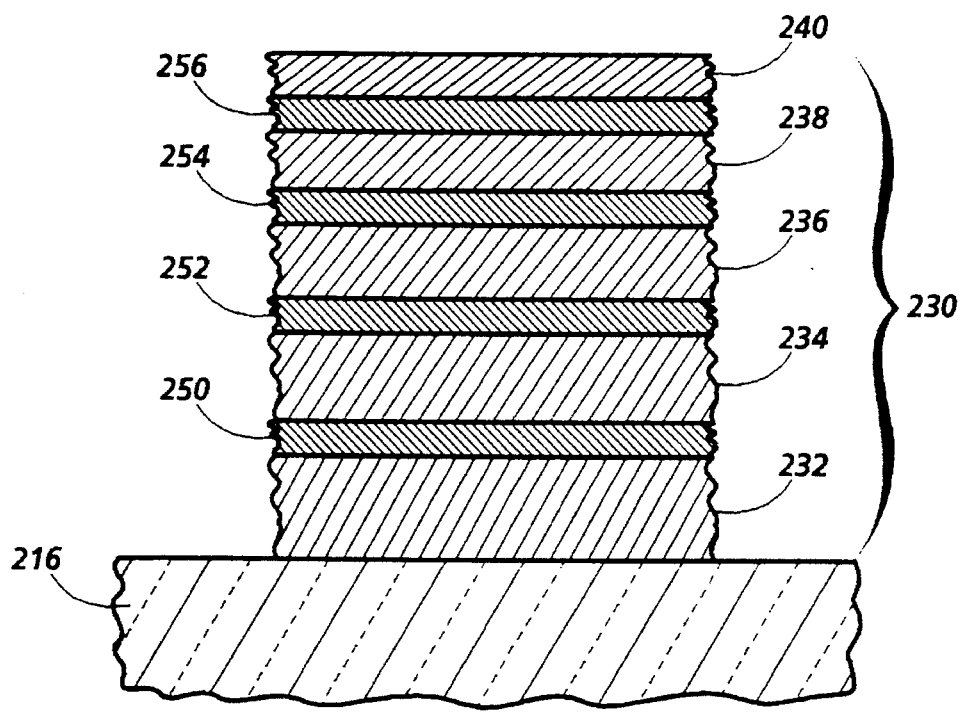
FIG. 16 is a schematic cross-section view of a layer that includes multiple sublayers, produced in the chamber of FIG. 15.
Figure 17:
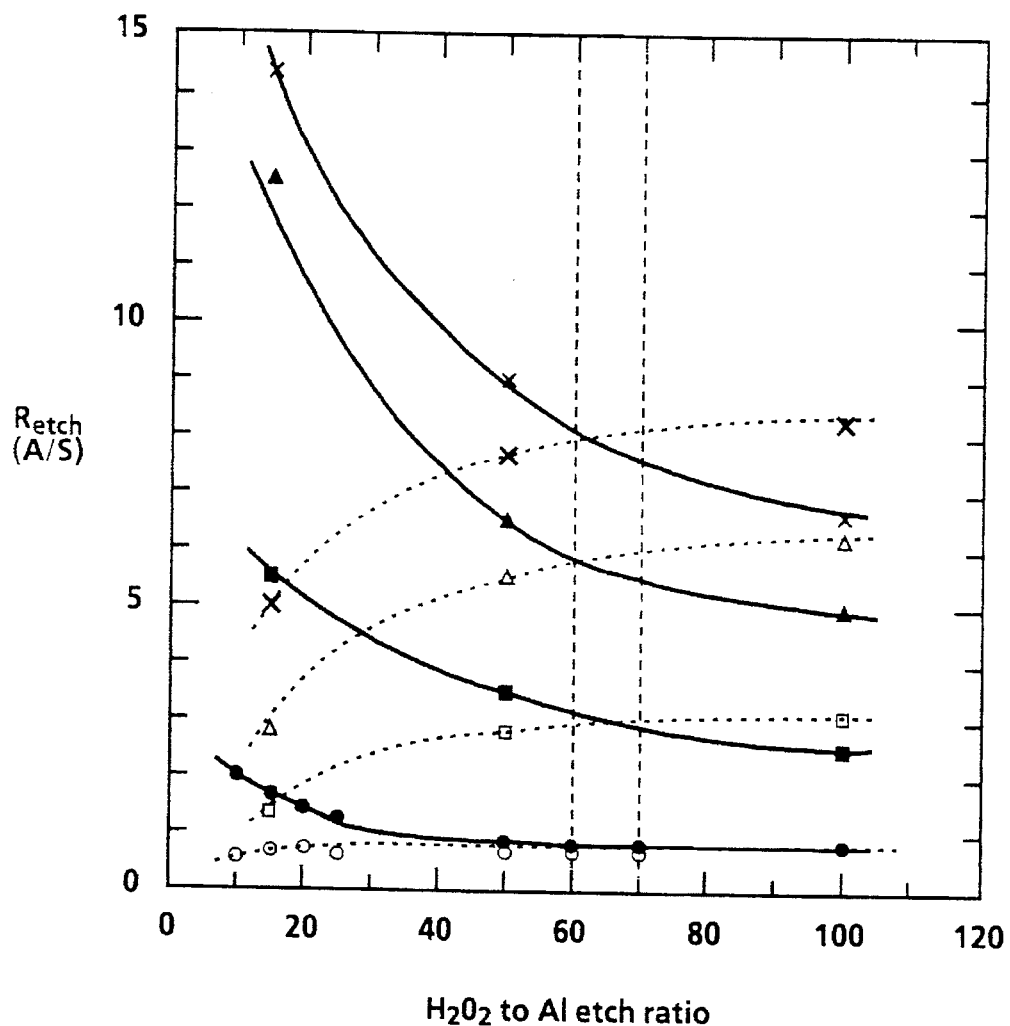
FIG. 17 is a graph showing etch rate as a function of ratios of etchants in a mixture and of etch temperature.
Figure 18:
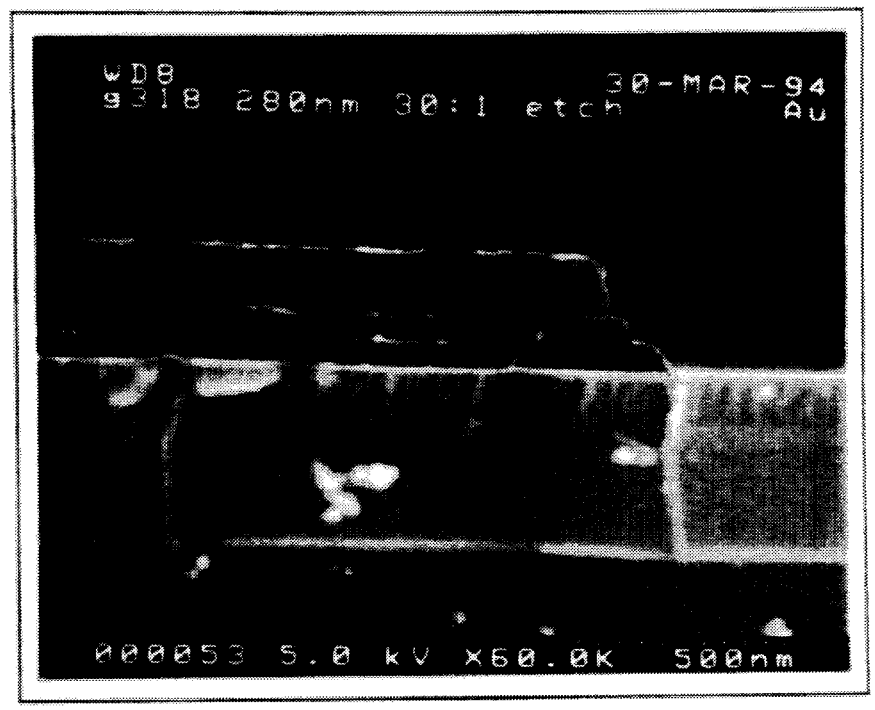
FIG. 18 is a scanning electron microscope view of a cross-section of a tapered feature produced from a layer as in FIG. 16.
Figure 19:
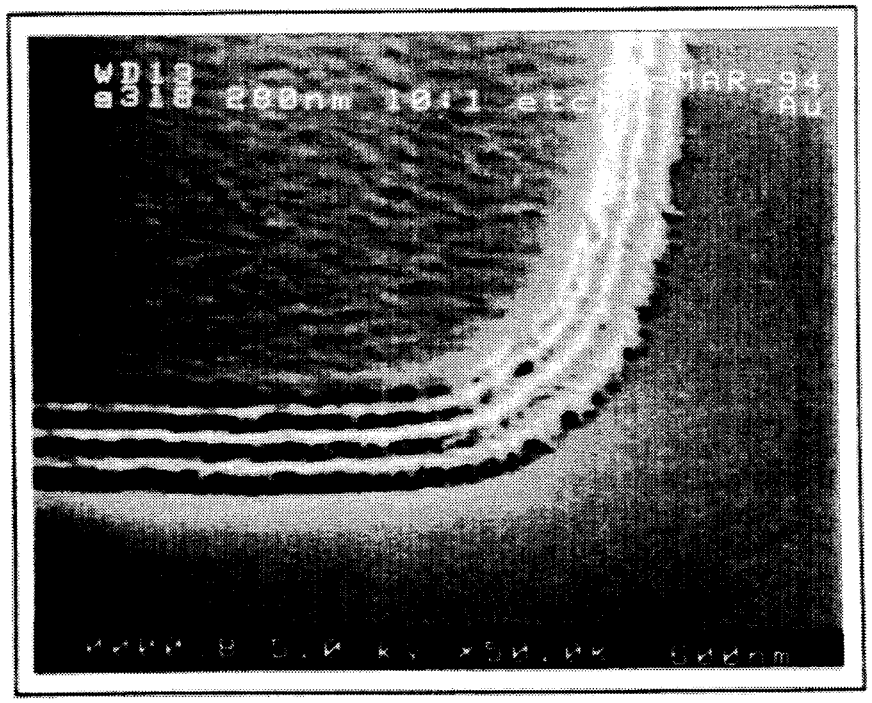
FIG. 19 is a scanning electron microscope top view of another tapered feature produced from a layer as in FIG. 16 but with a different ratio of etchants than FIG. 18.

FIG. 15 shows how two sputtering targets can be used to produce a layer with local etch rates as in FIG. 4. FIG. 16 shows a cross-section of a layer produced with the arrangement in FIG. 15. FIG. 17 illustrates etch rates of aluminum and titanium-tungsten as a function of etchant proportions at several temperatures. FIGS. 18 and 19 show actual features with tapered sidewall profiles at their edges, produced with the arrangement in FIG. 15.

Chamber 210 in FIG. 15 can be the same as in FIG. 8, but with target 212 aluminum and target 214 an alloy target of titanium and tungsten. An alloy target with commonly used proportions such as 10 percent titanium by weight could be used. Substrate 216 is within chamber 210, mounted so that it can be moved back and forth between a first position adjacent target 212 for deposition of aluminum and a second position adjacent target 214 for deposition of titanium-tungsten. Sputtering can be performed using conventional techniques, following the same acts as in FIG. 10, but with the acts in boxes 160 and 162 being replaced by a series of acts, each producing one of a number of sublayers and with alternate sublayers being aluminum, the aluminum sublayers being separated by titanium-tungsten sublayers.

FIG. 16 shows substrate 216 with layer 230 formed at its surface. Layer 230 includes aluminum sublayers 232, 234, 236, 238, and 240, separated by titanium-tungsten sublayers 250, 252, 254, and 256. Aluminum sublayers 232, 234, and 236 can each be 600 angstroms thick, while aluminum sublayer 238 can be 400 angstroms thick, and aluminum sublayer 240 can be 200 angstroms thick. Titanium-tungsten sublayers 250, 252, 254, and 256 can each be 100 angstroms thick.

FIG. 17 illustrates etch rates, measured in angstroms per second, for different mixtures of etchants at different etch temperatures, illustrating why materials that are etched by different subetchants can be used to produce sublayers with different local etch rates. The subetchant for titanium-tungsten is $H_2O_2$, while that for aluminum is a standard aluminum etchant with $H_3PO_4$ being the predominant constituent. At an etch temperature of 50° C., a low ratio of $H_2O_2$ to aluminum subetchant such as 10–30:1 produces significantly different etch rates.

FIG. 18 shows an SEM image of a cross-section of a feature produced by etching a layer like that in FIG. 16 using a 30:1 ratio of $H_2O_2$ to aluminum subetchant. The resulting angle of elevation at the edge of the feature is approximately 52°.

FIG. 19 shows an SEM top view of another feature produced by etching a layer like that in FIG. 16 using a 10:1 ratio of $H_2O_2$ to aluminum subetchant. As can be seen, the angle of elevation in FIG. 19 is significantly smaller than in FIG. 18.

FIGS. 18 and 19 show that edges with tapered sidewall profiles have been successfully produced using the multiple sublayer technique described above.

C.4. Variations

The implementations described above use sputtering to deposit materials such as molybdenum-chromium, aluminum, and titanium-tungsten. Other physical vapor deposition techniques could be used, such as vacuum evaporation and e-beam deposition.

The implementations described above use materials such as molybdenum-chromium, aluminum, and titanium-tungsten and appropriate etchants for those materials. Other materials and etchants could be used. For example, it may be possible to obtain a tapered dielectric or doped semiconductor feature using the techniques described above.

The implementations described above use particular thicknesses of layers and atomic proportions of materials within layers, but other thicknesses and atomic proportions could be used. In addition, it may be possible to implement the invention with continuously varying etch rates rather than with layers that have different etch rates.

The implementations described above use wet etchants, but dry etchants might also be useful.

Figure 20:
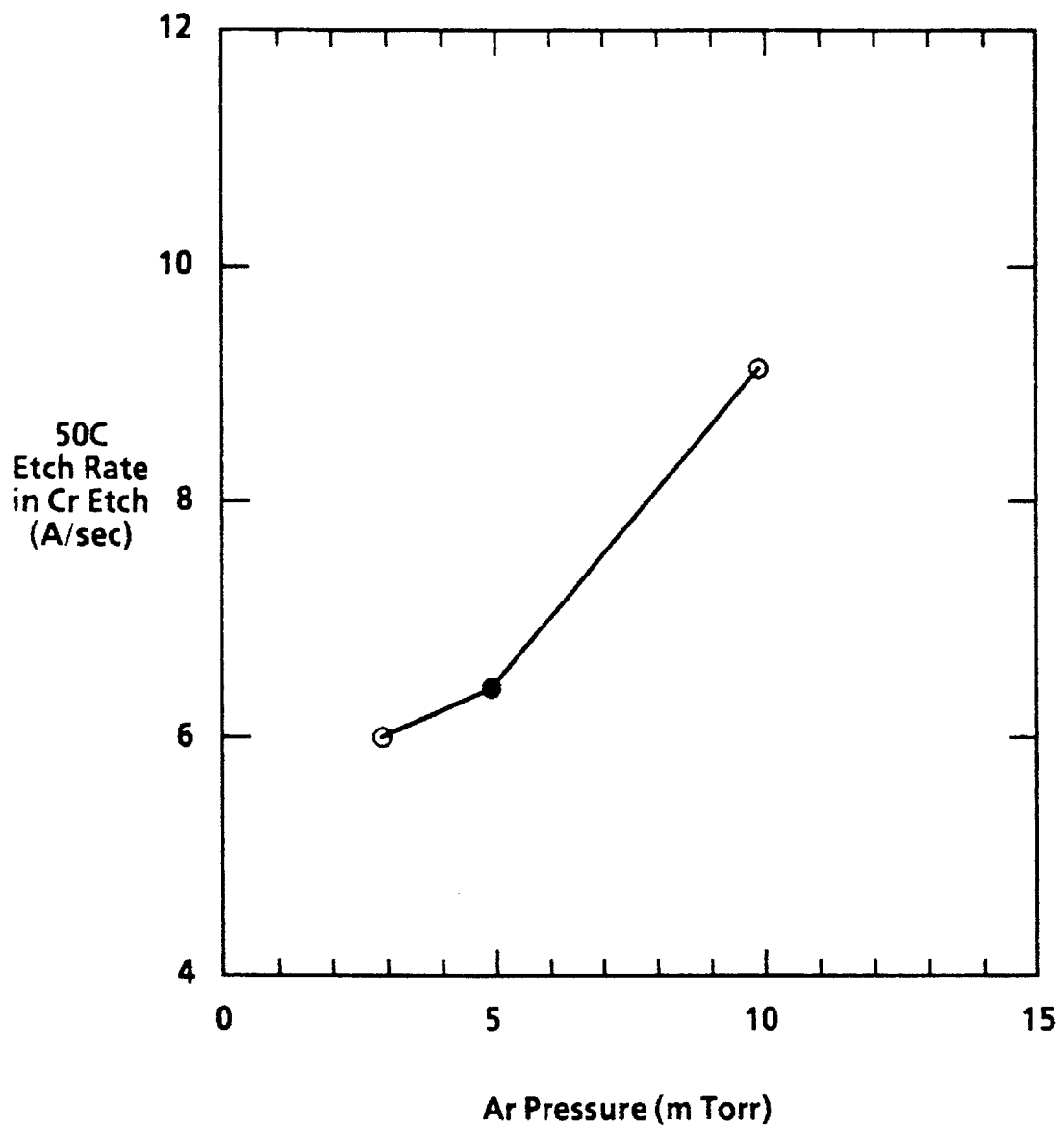
FIG. 20 is a graph showing etch rate as a function of gas pressure during deposition.

The implementations described above use differences in etch rates that result either from differences in atomic proportions of metals in an alloy or from differences in proportions of subetchants in an etchant. FIG. 20 shows etch rates as a function of argon pressure during etching, showing that differences in deposition conditions can produce significant differences in local etch rates in a layer. A further variation would be to dope an elemental metal film with impurities that affect the etch rate, such as an $N_2$-Ar mixture in a sputtering gas to incorporate nitrogen into a film of titanium.

The two layer implementation described above uses differences in atomic proportions, but could instead use etch rates that result from differences in proportions of subetchants in an etchant. For example, titanium-tungsten capping layer on an aluminum conductive line could be etches using a mixture of $H_3PO_4$ and $H_2O_2$ to obtain tapered sidewall profiles.

The implementations described above produce conductive lines and similar features, but the invention could be used to produce various other features with various shapes and types of tapered sidewall profiles, including reverse tapered features appropriate for liftoff techniques.

The implementations described above are appropriate for an insulating substrate such as glass, but the invention could be implemented in thin-film structures in other types of substrates, such as polysilicon.

The implementations described above employ specific process steps in a specified order. It may be possible to implement the invention with steps in different orders or with other process steps.

D. Application

The invention could be applied in many ways, including production of an array for an active matrix liquid crystal display (AMLCD), as described in the Array Application. For example, it may be possible to use the invention in producing a scanning array with a thin-film structure or another structure with conductive lines that connect leads of components.

The invention could also be applied in any conventional process for producing integrated circuits, not just in producing arrays for displays and other purposes.

E. Miscellaneous

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:
   a substrate that has a surface; and
   a thin-film structure formed at the surface of the substrate;
      the thin-film structure comprising:
         a feature with a first side toward the surface of the substrate and a second side away from the surface of the substrate; the feature having an edge extending in a thickness direction from the first side to the second side; the feature having a local etch rate for an etchant that varies with position in the thickness direction; the edge having a sidewall profile that is tapered by an etching operation using the etchant; the feature comprising a first element and a second element, the atomic ratio of the first and second elements varying in the thickness direction.

2. The product of claim 1 in which the feature is a conductive line.

3. The product of claim 1 in which the first and second elements are metals.

4. The product of claim 3 in which the first element is molybdenum and the second element is chromium; the atomic ratio of molybdenum to chromium at the first side being approximately 83/17 and the atomic ratio of molybdenum to chromium at the second side being approximately 87/13; the sidewall profile having an angle of elevation of approximately 60°.

5. The product of claim 3 in which the first element is molybdenum and the second element is chromium; the atomic ratio of molybdenum to chromium at the first side being approximately 85/15 and the atomic ratio of molybdenum to chromium at the second side being approximately 60/40; the sidewall profile having an angle of elevation of approximately 6°.

6. The product of claim 1 in which the atomic ratios of the first and second elements vary continuously across the feature from the first side to the second side.

7. The product of claim 1 in which the feature includes a first sublayer at the first side and a second sublayer at the second side; the first sublayer having a first atomic ratio with a first local etch rate and the second sublayer having a second atomic ratio with a second local etch rate; the first and second local etch rates being different.

8. The product of claim 1 in which the sidewall profile has an angle of elevation no greater than 60°.

9. The product of claim 8 in which the sidewall profile has an angle of elevation no greater than 30°.

10. The product of claim 8 in which the sidewall profile has an angle of elevation no greater than 6°.

11. The product of claim 1 in which the substrate is an insulating substrate.

12. A product comprising:

an insulating substrate that has a surface; and a thin-film structure formed at the surface of the insulating substrate; the thin-film structure comprising:

an array of light control units for causing presentation of images; each light control unit having a lead for receiving a unit signal; each light control unit responding to its unit signal by causing presentation of a segment of images presented by the array; and two or more conductive lines, each comprising first and second metals; each conductive line being connected to the lead of each of a set of the light control units for providing a unit signal to the light control units in the set; each conductive line having a first side toward the surface of the substrate and a second side away from the surface of the substrate; each conductive line having edges extending in a thickness direction from the first side to the second side, the atomic ratio of the first and second metals varying in the thickness direction within each conductive line; each conductive line having a local etch rate for an etchant that varies with position in the thickness direction; the etchant being a liquid; the local etch rate being a rate at which a wet etching operation using the etchant removes material from a layer from which the conductive lines are formed; the edges of each conductive line having a sidewall profile that is tapered by the wet etching operation using the etchant due to variation of the local etch rate in the thickness direction.

13. The product of claim 12 in which the first metal is molybdenum and the second metal is chromium.

14. A product comprising:

a substrate that has a surface; and a thin-film structure formed at the surface of the substrate; the thin-film structure comprising:

a feature with a first side toward the surface of the substrate and a second side away from the surface of the substrate; the feature having an edge extending in a thickness direction from the first side to the second side; the feature having a local etch rate for a mixed etchant that varies with position in the thickness direction; the mixed etchant being a liquid mixture of first and second etchants; the local etch rate being a rate at which a wet etching operation using the mixed etchant removes material from a layer from which the feature is formed; the edge having a sidewall profile that is tapered by the wet etching operation using the mixed etchant due to variation of the local etch rate in the thickness direction; the feature comprising a first element and a second element, the atomic ratio of the first and second elements varying in the thickness direction.

15. The product of claim 14 in which the tapered sidewall profile has an angle of elevation; the angle of elevation depending on the proportions of the first and second etchants in the mixed etchant.

* * * * *